United States Patent [19]

Skerlos et al.

[11] 4,424,594
[45] Jan. 3, 1984

[54] EXTENDED RANGE TUNABLE RESONANT CIRCUIT FOR A VHF TELEVISION RECEIVER TUNING SYSTEM

[75] Inventors: Peter C. Skerlos; Peter Strammello, Jr., both of Arlington Heights, Ill.

[73] Assignee: Zenith Radio Corporation, Glenview, Ill.

[21] Appl. No.: 308,018

[22] Filed: Oct. 5, 1981

[51] Int. Cl.³ .............................................. H04B 1/26
[52] U.S. Cl. .................................. 455/180; 334/15; 455/190; 455/191
[58] Field of Search ............... 455/180, 188, 189, 190, 455/191; 334/15; 357/14

[56] References Cited

U.S. PATENT DOCUMENTS

| 4,002,986 | 1/1977 | Ma | 455/180 |
| 4,271,529 | 6/1981 | Strammello, Jr. | 455/180 |
| 4,363,135 | 12/1982 | Moon | 455/180 |

OTHER PUBLICATIONS

"TV Tuners Using Low Loss and Low Distortion GaAs Varacter Diodes", Hara et al., IEEE Trans. on Consumer Electronics, vol. CE-26, May 1980, pp. 172-179.

"Resistance of GaAs Varactor Diodes for T.V. Tuners", Hara et al., IEEE Trans. on Consumer Electronics, vol. CE-26, Nov. 1980, pp. 729-736.

"High Performance UHF Varactor Tuner with Dual-Gate GaAs MESFET and GaAs Varactor Diodes", Sato et al., IEEE Trans. on Consumer Electronics, vol. CE-26, Aug. 1980, pp. 423-430.

*Primary Examiner*—Marc E. Bookbinder

[57] ABSTRACT

An extended range tunable resonant circuit for use in a VHF television receiver tuning system comprises a bandswitchable inductive network connected to a low series resistance gallium arsenide varactor diode. The resonant circuit, when operated in response to appropriate bandswitching signals and tuning voltages, is effective for establishing a plurality of tuning bands collectively defining an extended sub-UHF tuning range from about 54 MHz to at least 408 MHz.

5 Claims, 3 Drawing Figures

EXTENDED RANGE TUNABLE RESONANT CIRCUIT FOR A VHF TELEVISION RECEIVER TUNING SYSTEM

BACKGROUND OF THE INVENTION

The present invention relates generally to voltage-controlled tuning systems for tuning a television receiver to a desired television channel and, more specifically, to a super-wideband, bandswitchable resonant circuit for use in a VHF television receiver tuner.

A VHF television tuner is conventionally designed for tuning anyone of twelve VHF television channels divided into two non-adjacent frequency bands. In accordance with the transmission standards existing in the United States, the first five channels, channels 2-6, fall within the low VHF band which extends from 54 to 88 MHz. The remaining seven VHF channels, channels 7-13, occupy the high VHF band extending between 174 and 216 MHz. Also, an increasing number of additional sub-UHF television signals are broadcast over a number of cable television (CATV) channels. Eleven of such CATV channels, channels A-2 to I, are broadcast in a mid-band frequency range extending between 108 and 174 MHz while an additional 14 channels, channels J-W, are broadcast in a superband frequency range which extends from 216 to 300 MHz. A final group of 18 CATV channels, channels AA-RR, occupy the so-called hyperband frequency range extending between 300 and 402 MHz. The present invention concerns techniques for enabling a VHF television receiver tuner to tune the extremely wide frequency range encompassing all of the foregoing sub-UHF television channels; namely, VHF channels 2-13 and CATV channels (A-2)-I and J-RR.

Prior art attempts to tune the above-described 55 VHF/CATV channels have typically involved the use of relatively complex and costly tuner circuits, these circuits being embodied either in the form of a special converter unit located external of the television receiver or as a "built-in" system integrally associated with the television receiver circuitry. In one known system, the tuning circuitry actually comprises two separate tuning sub-systems, each sub-system designed to tune a respective portion of the sub-UHF frequency spectrum encompassing the 55 VHF/CATV channels. In another proposed system, the tuner comprises a plurality of resonant circuits; each resonant circuit having four bandswitchable tuning configurations, one covering the low VHF channels, a second covering the high VHF and mid-band CATV channels, a third covering the superband CATV channels and a final configuration covering the hyperband CATV channels.

U.S. Pat. No. 4,271,529 to Strammello, Jr., which patent is incorporated herein by reference and will hereinafter be referred to as the Strammello patent, teaches a VHF tuner in which each of a plurality of resonant circuits are characterized by three bandswitchable tuning configurations. One of the tuning configurations enables tuning to all channels in the low VHF band (54-88 MHz), a second to the channels in the CATV mid-band and the VHF high band (120-216 MHz) and the final tuning configuration enabling tuning of CATV superband channels J-W (216-300 MHz). The tuning range of the final band (216-300 MHz) is limited to less than one-half octave as a result of the increasing circuit losses characterizing the system at these elevated sub-UHF, CATV channel frequencies as well as by the series resistance introduced by the bandswitching diodes used to establish the tuning configuration of the resonant circuits. As a result, the system contemplated in the Strammello patent is considered incapable of tuning the CATV hyperband channels (300-402 MHz) without seriously degraded system performance.

It is therefore a basic object of the present invention to provide an improved resonant circuit for a VHF television receiver tuner enabling tuning of all VHF and CATV television channels in the sub-UHF frequency range extending between 54 and 402 MHz.

It is a further object of the invention to provide a VHF tuner having a plurality of relatively non-complex resonant circuits each of which may be tuned over an extremely wide portion of the sub-UHF frequency spectrum without significantly degrading system performance.

It is yet another object of the invention to provide a resonant circuit for a VHF tuner including means for compensating or off-setting the increased circuit losses experienced when tuning the higher sub-UHF frequency CATV channels.

It is still a further object of the invention to provide a resonant circuit for a VHF tuner which is characterized by a single sub-UHF tuning band covering CATV superband channels J-K and CATV hyperband channels AA-RR (216-402 MHz).

BRIEF DESCRIPTION OF THE DRAWING

The features of this invention which are believed to be novel are set forth with particularity in the appended claims. The invention, together with its objects and the advantages thereof, may be best understood by reference to the following description taken in conjunction with the accompanying drawings, in which:

DESCRIPTION OF THE PREFERRED EMBODIMENT

As previously described, the Strammello patent teaches a bandswitchable, tunable resonant circuit for a multiband VHF television tuner. The present invention, which in an exemplary embodiment, incorporates the circuit arrangement of the resonant circuits disclosed in the Strammello patent, contemplates an improvement thereto whereby the tuning range thereof may be significantly increased without degradation of system performance and without any increase in circuit complexity. In this regard, it is to be understood that the teachings of the invention are equally applicable to resonant circuits embodied in diverse other circuit arrangements not shown in the Strammello patent.

Figure 3:
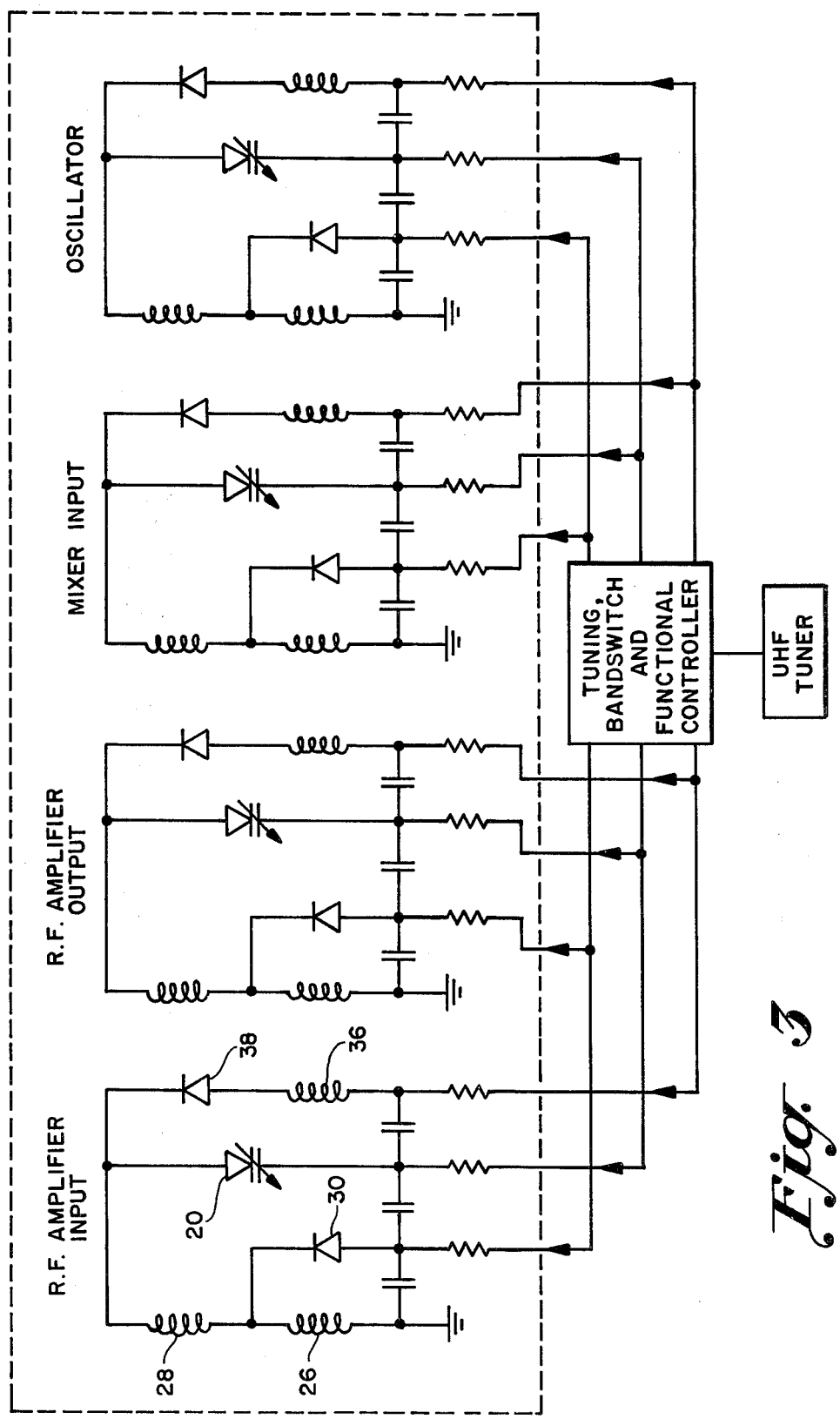
FIG. 3 is a schematic diagram illustrating a VHF television tuner including a plurality of resonant circuits configured as shown in the previously mentioned Strammello patent as well as in accordance with the present invention.

With specific reference now to FIG. 3, which illustrates a plurality of resonant circuits each configured according to both the Strammello patent and the improvement thereof represented by the present invention, it will be observed that each comprises a low band inductor 26 connected in series with a mid/high band inductor 28, a varactor diode 20 being connected in parallel across the series inductor combination. A superband inductor 36 is connected in parallel across the varactor diode. A first bandswitching diode 30 is connected in shunt with the low band inductor and a second bandswitching diode 38 is connected in series with the superband inductor. In order to tune the low VHF band of television channels (54–88 MHz), the bandswitching diodes are biased such that they are both rendered non-conductive. As a result, the resonant circuit effectively comprises the capacitance of varactor diode 20 connected in parallel with the series combination of the low and mid/high band inductors 26 and 28. The entire low VHF band may be tuned by appropriately varying the capacitance of the varactor diode through the application a tuning voltage varying between about 2–10 volts.

In order to tune the sub-UHF frequencies encompassing the high VHF channels (174–216 MHz) and the mid-band CATV channels (108–174 MHz) the first bandswitching diode 30 is rendered conductive to shunt the low band inductor thereby reducing the inductance connected across the varactor diode. The tuning voltage applied to the varactor diode is varied between about 2–25 volts to tune the channels in this band. As taught in the Strammello patent, a final and third band of sub-UHF television channels, the CATV superband extending between 216–300 MHz, may be tuned in response to a further reduction in the inductance of the resonant circuit by rendering both the first and second bandswitching diodes conductive such that the superband inductor is connected in parallel with the mid/-high band inductor.

It will be observed that the mid/high band defines a frequency range encompassing nearly an octave of sub-UHF frequencies (120–216 MHz). Any further extension of this tuning range is primarily limited by the tuning range of the varactor diode, i.e. the maximum capacitance variation of the varactor. Thus, to tune beyond 216 MHz a third band is employed, the third band being effected by enabling the second bandswitching diode. However, while the enabled second bandswitching diode permits tuning of a third band of sub-UHF frequencies beyond 216 MHz, it also introduces additional series resistance (about 0.4 Ohms) into the resonant circuits. In addition, circuit losses increase as a function of increased operating frequency. As a result of these increased circuit losses and the additional series resistance introduced by the second bandswitching diode, the tuning range of this third band is limited to significantly less than a full octave in the Strammello system. In particular, acceptable circuit performance can only be achieved over a range of less than one-half octave, i.e. from about 216 MHz to about 300 MHz. Any attempt to tune beyond 300 MHz results in severely degraded performance. As a consequence, the three band resonant circuit taught in the Strammello patent cannot be used to adaquately tune the hyperband CATV television channels encompassing the sub-UHF frequency spectrum extending from 300 to 402 MHz.

As described above, the limited superband tuning range characterizing the resonant circuit of the Strammello patent is largely due to the increased circuit losses prevalent at these elevated sub-UHF operating frequencies and also to the additional series resistance introduced into the resonant circuits by the second bandswitching diode. According to the present invention, the tuning range of a varactor-type VHF tuner, such as disclosed in the Strammello patent and illustrated in FIG. 3, may be greatly expanded to allow tuning of the sub-UHF CATV hyperband channels without the additional complexity associated with the prior art. This is made possible by the recognition that the increased circuit losses associated with operation of the resonant circuits at the elevated sub-UHF operating frequencies of the CATV hyperband may be offset or compensated by the use of a low series resistance varactor diode in lieu of the conventional relatively high series resistance silicon varactor diodes conventionally used in VHF tuner resonant circuits.

More particularly, VHF television receiver tuners such as illustrated in FIG. 3, conventionally incorporate conventional silicon varactor diodes which typically exhibit a series resistance of about 0.8 Ohms. This relatively high level of series resistance, when taken in combination with the increased circuit losses characterizing the tuner circuitry at the elevated sub-UHF hyperband frequencies, loads the resonant circuits to an extent seriously degrading their performance when attempting to tune a CATV hyperband channel. In order to reduce these deleterious effects, the present invention contemplates the use of low series resistance varactor diodes, e.g. gallium arsenide varactor diodes, in place of the conventional silicon varactor diodes typically used in VHF tuner resonant circuits such as illustrated in FIG. 3. Gallium arsenide varactor diodes exhibits a series resistance of only about 0.3 Ohms as compared to the 0.8 Ohms series resistance characterizing conventional silicon varactor diodes. As a result, using a gallium arsenide varactor diode in a VHF tuner resonant circuit such as disclosed in the Strammello patent and illustrated in FIG. 3 allows an extended tuning range at higher sub-UHF frequencies before the circuits become loaded to the point where satisfactory tuner performance can no longer be achieved. In particular, with the use of gallium arsenide varactor diodes in the VHF resonant circuit arrangement of FIG. 3, it is possible to extend the superband tuning range to include the CATV hyperband channels located between the sub-UHF frequencies of 300 and 402 MHz.

Hyperabrupt gallium arsenide varactor diodes have been used as capacitive tuning elements in microwave applications, e.g. in the Ku band, because of their relatively high Q characteristic. In addition, it has been proposed to use gallium arsenide diodes in UHF television receiver tuners in order to comply with FCC noise figure requirements. However, it has heretofore not been recognized that the low series resistance characteristics of gallium arsenide varactor diodes could advantageously be exploited at lower frequencies to enable extending the tuning range of a VHF television receiver tuner to encompass the television channels occupying the sub-UHF frequency spectrum between about 57–405 MHz. Moreover, this extended tuning range may be achieved without increasing the complexity of the VHF tuner circuitry.

Figure 1:
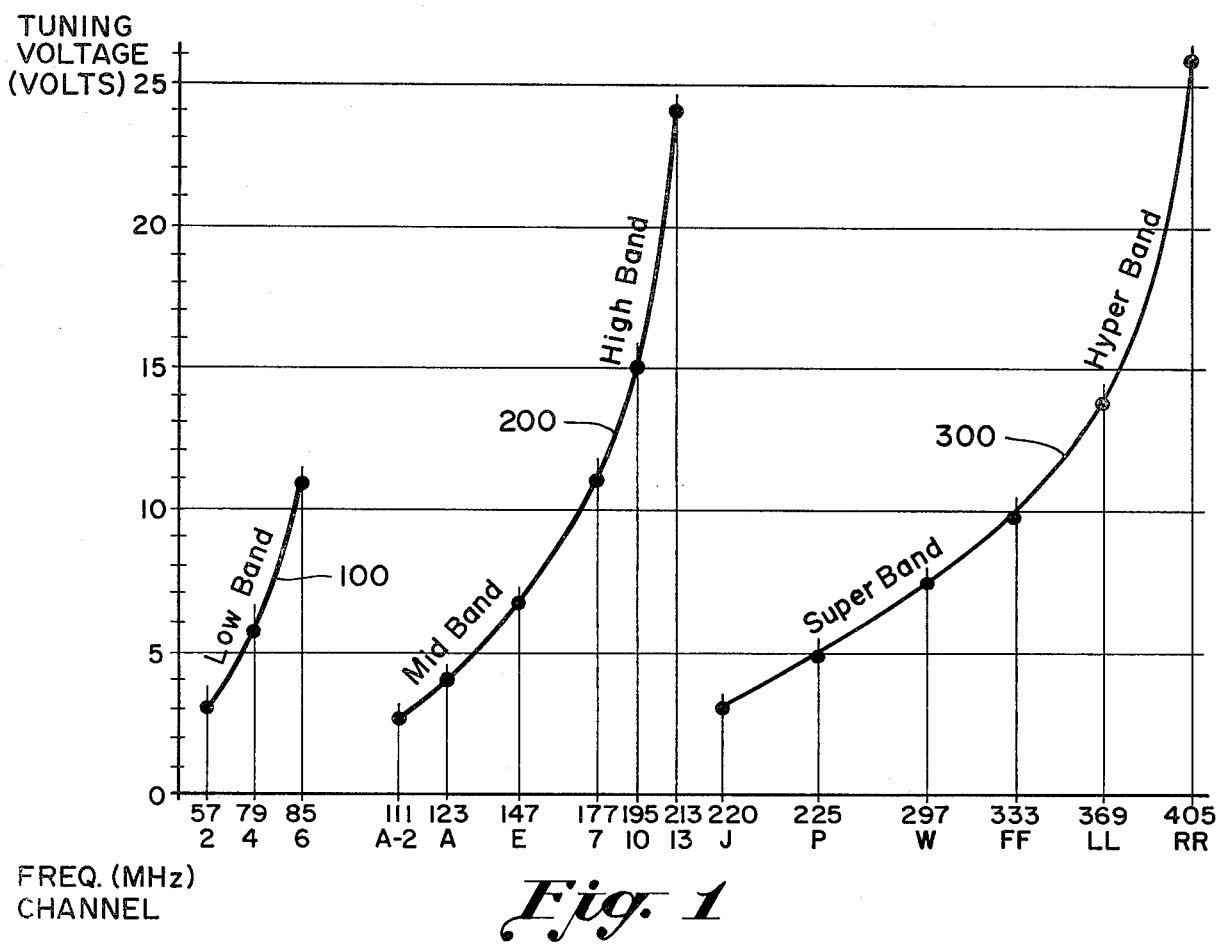
FIG. 1 illustrates the relationships between the tuning voltage, individual television channels, and tuning bands in the sub-UHF frequency range of a resonant circuit constructed according to the invention and intended for use in a VHF television tuner.
Figure 2:
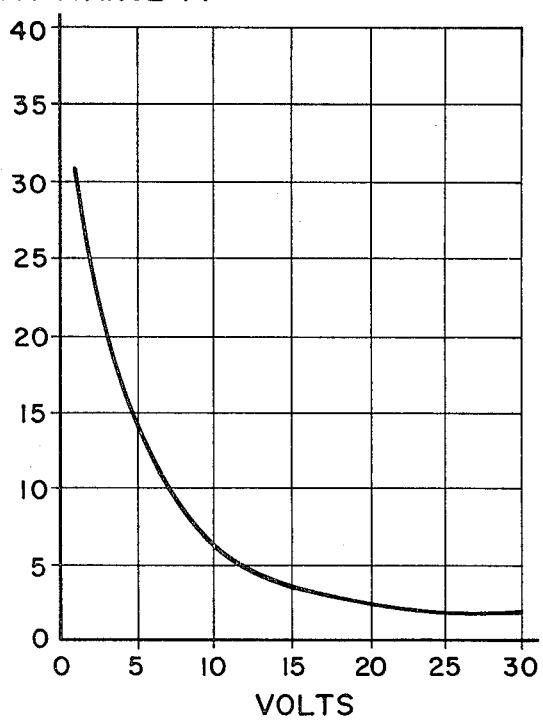
FIG. 2 illustrates the capacitance versus voltage characteristic of the varactor diode used in the resonant circuit of the invention.

FIG. 1 illustrates the relationships between tuning voltage, individual television channels and tuning bands in the sub-UHF frequency spectrum when a gallium arsenide tuning varactor is used in the VHF tuner resonant circuits of FIG. 3 according to the present invention. Each individual band is realized by appropriately biasing the bandswitching diodes as previously explained whild tuning within a given band is effected by suitably varying the tuning voltage applied to the gallium arsenide varactor diode. FIG. 2 illustrates the capacitance characteristic of the varactor diode as a function of the applied tuning voltage.

From the Figures it can be seen that the low VHF band tuning curve 100 is similar to the low VHF band tuning curve achieved with a silicon varactor as illustrated in the Strammello patent. In particular, the low VHF channels 2-6 (54-88 MHz) may be tuned, after the appropriate inductor configuration is effected, by varying the tuning voltage between about 3-11 volts whereby the capacitance of the gallium arsenide varactor is varied between about 5-20 picofarads. The CATV midband and VHF high band tuning curve 200 is also substantially similar to the corresponding curve in the Strammello patent. The major difference between the two curves resides in the fact that an additional two CATV channels, channels A-2 and A-1, are accomodated by the tuning band when the gallium arsenide tuning varactor is employed thereby increasing the tuning range by 12 MHz. Tuning curve 200, therefore, enables tuning of CATV channels A-2 to I (108-174 MHz) and high VHF channels 7-13 (174-216) by varying the tuning voltage applied to the gallium arsenide varactor diode between about 2.5-24 volts such that a capacitance variation between about 2-22 picofarads is achieved. A much more sugnificant difference, however, will be noted between the tuning curve 300 and the corresponding curve in the Strammello patent. Due to the increased circuit losses resulting from operation of a VHF tuner at the elevated sub-UHF superband frequencies, the tuning range realizable when using a conventional high series resistance silicon varactor diode is limited to less than one-half octave; in particular, to the thirteen CATV superband channels extending between 216 and 300 MHz. In accordance with the present invention, and as illustrated in FIG. 1, this sub-UHF tuning band is greatly increased covering nearly a full octave of frequencies by using a gallium arsenide tuning varactor in place of the conventional silicon varactor. As will be seen in the Figures, the tuning range of this band is extended to include all of the CATV hyperband channels extending from 300 to 402 MHz by varying the applied tuning voltage between about 3-26 volts for effecting a capacitance variation of about 2-20 picofarads.

What has thus been shown is an improved VHF tuner employing a plurality of resonant circuits each of which incorporates a gallium arsenide tuning varactor for providing a significantly increased sub-UHF tuning range without degrading performance nor increasing circuit complexity.

While a particular embodiment of the invention has been shown and described, it would be obvious to those skilled in the art that changes and modifications may be made thereto without departing from the invention in its broader aspects and, therefore, the aim in the appended claims is to cover all such changes and modifications as fall within the true spirit and scope of the invention.

We claim:

1. An extended range tunable resonant circuit for use in a VHF television receiver tuning system comprising:
   a bandswitchable inductive network including at least two bandswitch diodes each having a conductive state characterized by a relatively large series resistance;
   a gallium arsenide varactor diode characterized by a relatively low series resistance coupled to said inductive network;
   means for applying a variable tuning voltage to said gallium arsenide varactor diode for adjusting the capacitance exhibited thereby within a predetermined range; and
   means for selectively controlling the states of said bandswitch diodes for interconnecting said gallium arsenide varactor diode and said inductive network in at least three different circuit configurations, each of said circuit configurations being characterized by a different value of effective inductance and wherein the relatively large series resistance of the bandswitch diodes are at least partially offset by the relatively low series resistance of the gallium arsenide varactor diode for allowing tuning of a respective band of a plurality of respective band of sub-UHF television channels in response to a variation in said applied tuning voltage, said tuning bands collectively defining an extended sub-UHF tuning range extending from about 54 MHz to at least 408 MHz.

2. An extended range tunable resonant circuit for use in a VHF television receiver tuning system comprising:
   a band switchable inductive network including at least two bandswitch diodes each having a conductive state characterized by a relatively large series resistance;
   a gallium arsenide varactor diode characterized by a relatively low series resistance coupled to said network;
   tuning means for applying a variable tuning voltage to said gallium arsenide varactor diode for adjusting the capacitance exhibited thereby within a predetermined range; and
   bandswitch control means for controlling the states of said bandswitch diodes for interconnecting said gallium arsenide varactor diode and said inductive network in three circuit configurations, each of said circuit configurations being characterized by a different value of effective inductance and wherein the relatively large series resistance of the bandswitch diodes are at least partially offset by the relatively low series resistance of the gallium arsenide varactor diode for allowing tuning of a respective band of a plurality of respective bands of sub-UHF television channels in response to a variation in said applied tuning voltage, a first of said respective sub-UHF tuning bands defining a tuning range extending between about 54 MHz and 88 MHz, a second of said respective tuning bands defining a tuning range extending between about 108 MHz and 216 MHz and a third of said respective tuning bands defining a tuning range extending between about 216 MHz and at least 408 MHz.

3. An extended range tunable resonant circuit for use in a VHF television receiver tuning system comprising:
   a gallium arsenide varactor diode characterized by a relatively low series resistance and an effective capacitance determined in accordance with an applied tuning voltage;
   a network including at least two conductive bandswitch diodes each characterized by a relatively large series resistance, said network having a predetermined value of inductance connected in circuit with said gallium arsenide varactor diode and forming in combination therewith a resonant circuit; and means for applying a tuning voltage to said gallium arsenide varactor diode for effecting a capacitance variation thereof and wherein the relatively large series resistance of the bandswitch diodes are at least partially offset by the relatively low series resistance of the gallium arsenide varactor diode for enabling said resonant circuit to be tuned through a continuous extended band of sub-UHF frequencies including the television channels occupying the CATV superband and the CATV hyperband.

4. An extended range tunable resonant circuit for use in a VHF television receiver tuning system comprising:

a bandswitchable inductive network including at least two bandswitch diodes each having a conductive state characterized by a relatively large series resistance;

a gallium arsenide varactor diode characterized by a relatively low series resistance coupled to said network;

means for applying a variable tuning voltage to said gallium arsenide varactor diode for adjusting the capacitance exhibited thereby within a predetermined range; and means for selectively controlling the states of said bandswitch diodes for interconnecting said gallium arsenide varactor diode and said inductive network in at least three different circuit configurations, each of said circuit configurations being characterized by a different value of effective inductance and wherein the relatively large series resistance of the bandswitch diodes are at least partially offset by the relatively low series resistance of the gallium arsenide varactor diode for allowing tuning of a respective band of a plurality of respective bands of sub-UHF television channels in response to a variation in said applied tuning voltage, said tuning bands collectively defining an extended sub-UHF tuning range including the television channels occupying the low VHF band, the high VHF band, the CATV mid band, the CATV superband and the CATV hyperband.

5. An extended range tunable resonant circuit for use in a VHF television receiver tuning system comprising:

a gallium arsenide varactor diode characterized by a relatively low series resistance and an effective capacitance determined in accordance with an applied tuning voltage;

circuit means including at least two conductive bandswitch diodes each characterized by a relatively large series resistance, said circuit means having a predetermined value of inductance connected in circuit with said gallium arsenide varactor diode and forming in combination therewith a resonant circuit; and means for applying a tuning voltage to said gallium arsenide varactor diode for effecting a capacitance variation thereof and wherein the relatively large series resistance of the bandswitch diodes is at least partially offset by the relatively low series resistance of the gallium arsenide varactor diode for enabling said resonant circuit to be tuned through a continuous extended band of sub-UHF frequencies in the VHF/CATV television frequency spectrum.

* * * * *